(12) United States Patent
Ma et al.

(10) Patent No.: US 6,436,832 B1
(45) Date of Patent: Aug. 20, 2002

(54) METHOD TO REDUCE POLISH INITIATION TIME IN A POLISH PROCESS

(75) Inventors: Yutao Ma, Sunnyvale; Juilung Li, San Jose; Fred C. Redeker, Fremont; Tse-Yong Yao, San Francisco; Rajeev Bajaj, Fremont, all of CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 09/578,157

(22) Filed: May 23, 2000

(51) Int. Cl.$^7$ .............................................. H01L 21/00
(52) U.S. Cl. ........................ 438/692; 134/2; 134/26; 216/38; 216/88; 216/100; 438/745; 438/754
(58) Field of Search ................. 438/691, 692, 438/693, 745, 754; 216/38, 88, 89, 100; 134/1.3, 2, 3, 26; 252/79.4, 79.5

(56) References Cited

U.S. PATENT DOCUMENTS

| | | | |
|---|---|---|---|
| 5,738,574 A | | 4/1998 | Tolles et al. |
| 5,876,508 A | | 3/1999 | Wu et al. ...................... 134/2 |
| 5,897,379 A | * | 4/1999 | Ulrich et al. ............ 438/692 X |
| 5,899,801 A | | 5/1999 | Tolles et al. |
| 5,931,724 A | | 8/1999 | Perlov et al. |
| 5,934,980 A | * | 8/1999 | Koos et al. ............. 438/692 X |
| 5,944,582 A | | 8/1999 | Talieh |
| 5,957,751 A | | 9/1999 | Govzman et al. |
| 5,981,454 A | | 11/1999 | Small .......................... 510/175 |
| 6,033,993 A | | 3/2000 | Love, Jr. et al. ............. 438/745 |
| 6,068,879 A | | 5/2000 | Pasch ............................ 427/97 |
| 6,150,269 A | * | 11/2000 | Roy ......................... 438/745 X |
| 6,156,661 A | | 12/2000 | Small .......................... 438/692 |
| 6,162,301 A | | 12/2000 | Zhang et al. ................... 134/3 |
| 6,165,956 A | | 12/2000 | Zhang et al. ................ 510/175 |
| 6,258,721 B1 | | 7/2001 | Li et al. ...................... 438/693 |

FOREIGN PATENT DOCUMENTS

| JP | 11-40526 | 2/1999 |
|---|---|---|
| WO | WO 99/46353 | 9/1999 |

OTHER PUBLICATIONS

U.S. patent application No.: 09/163,582 "Improved Copper Cleaning Solution and Methods for Using Same" Brian J. Brown, Madhavi Chandrachood & Fred C. Redeker.

* cited by examiner

*Primary Examiner*—William A. Powell
(74) *Attorney, Agent, or Firm*—Moser, Patterson & Sheridan

(57) ABSTRACT

High through-put CMP is achieved by the application of a cleaning composition on to an exposed surface of a metal layer prior to polishing the bulk metal layer. Embodiments of the present invention include applying an aqueous composition containing citric acid and ammonium hydroxide in deionized water to remove a native oxide film that forms on a copper containing layer and then polishing the copper containing layer to substantially planarize the metal layer.

7 Claims, 1 Drawing Sheet

METHOD TO REDUCE POLISH INITIATION TIME IN A POLISH PROCESS

CROSS-REFERENCE TO RELATED APPLICATION

This application claims priority from co-pending patent application Ser. No. 09/163,582, filed Sep. 30, 1998 entitled "IMPROVED COPPER CLEANING SOLUTION AND METHOD FOR USING SAME" the entire disclosure of which is herein incorporated by reference.

FIELD OF THE INVENTION

The present invention generally relates to methods of polishing metal layers on semiconductor substrates. In particular, the present invention relates to a method of polishing a semiconductor substrate having a copper layer thereon by applying a cleaning composition in a chemical mechanical polishing process. The present invention is applicable to manufacturing integrated circuits having submicron design features and high conductivity interconnect structures.

BACKGROUND

Integrated circuits are typically formed on substrates, particularly semiconductor substrates, such as silicon wafers, by sequentially depositing and etching conductive, semiconductive and/or insulative layers to ultimately form a plurality of features and devices. The active devices, which are initially isolated from one another, are interconnected to form functional circuits and components through the use of multilevel interconnections.

Interconnection structures typically have a first layer of metallization, comprising a conductive pattern and interwiring spaces, a second level of metallization, and frequently third and subsequent levels of metallization. Interlevel dielectrics, such as doped and undoped silicon dioxide, are used to electrically isolate the different levels of metallization in a silicon substrate. Typically, conductive patterns on different layers, i.e. upper and lower layers, are electrically connected by a conductive plug filling a via hole, while a conductive plug filling a contact hole establishes electrical contact with an active region on a semiconductor substrate, such as a source/drain region. Conductive lines are formed in trenches that typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten. Excess conductive material on the surface of the dielectric interlayer is typically removed by chemical mechanical polishing (CMP).

CMP is pervasively employed at strategic stages in the fabrication of semiconductor devices to remove topographical irregularities and/or reduce the thickness of a particular layer to achieve planar surfaces and/or thinner layers. Generally, CMP involves subjecting a target surface to mechanical abrasion and chemical action, as with a polishing pad and abrasive chemical slurry, to effect removal of surface materials.

In conventional CMP techniques, a semiconductor substrate in need of planarization and/or thinning is mounted on a carrier or polishing head. The exposed surface of the substrate is then placed against a rotating polishing pad that in turn is mounted on a rotating platen driven by an external driving force. The carrier provides a controllable force, i.e. pressure, urging the substrate against the rotating polishing pad. Additionally, the carrier may rotate to affect the relative velocity distribution over the surface of the substrate. A polishing slurry may be distributed over the polishing pad to provide an abrasive chemical solution at the interface between the pad and substrate.

Typically, polishing slurries contain an abrasive and a mixture of compounds including oxidizers, inhibitors and complexing agents. The slurry initiates the polishing process by chemically reacting with the layer being polished. The polishing process is facilitated by the rotational movement of the pad relative to the substrate as slurry is provided to the substrate/pad interface. The dual mechanisms effect the chemical and mechanical polishing of the target layer. Polishing is continued in this manner until the desired layer is appropriately planarized, thinned, or removed.

In applying conventional planarization techniques, such as CMP, to copper (Cu), it is extremely difficult to achieve a high degree surface uniformity, particularly across a surface extending from a dense array of Cu features, e.g., Cu lines, bordered by an open field. A dense array of metal (Cu) features is typically formed in an interlayer dielectric, such as a silicon oxide layer, by a damascene technique wherein trenches are initially formed. A barrier layer, such as a tantalum (Ta) containing layer is then deposited lining the trenches and on the upper surface of the silicon oxide interlayer dielectric. Cu or a Cu alloy is then deposited by conventional copper or copper alloy forming techniques. Excess Cu or Cu alloy is then removed, by one or more polishing steps including employing different polishing pads under different polishing conditions, the barrier layer and any remaining Cu or Cu alloy is then removed by yet another polishing step. Finally excess slurry and/or particles are removed from the planarized surface by rinsing the substrate, typically with deionized water.

After planarizing and exposing the partially planarized bare metal surface to deionized water, there is a propensity for the metal, particularly a metal layer containing Cu, to from an oxide layer on exposed surfaces thereof, e.g., a nascent or atomic oxide layer forms on the metal surface, particularly when the metal is exposed to air or an aqueous environment. To minimize oxidation of an exposed metal layer before or during CMP, inhibitors have been added to CMP slurries. These inhibitors react and/or complex with the metal forming of a film of the inhibitor on the surface of the metal thereby reducing the availability of the metal surface to oxidants. A nascent oxide layer or an inhibitor layer is particularly problematic, however, in multi-step polishing processes because these layers retards CMP of the bulk target layer thereby increasing the time necessary to complete polishing of the copper layer, reducing through-put and increasing processing costs.

Improved CMP materials and methodology for planarizing and/or thinning layers and thin films associated with smaller-sized design features in semiconductor fabrication is needed which reduce surface imperfections, defects and erosion. There exists a particular need for a CMP process for planarizing Cu and Cu metal alloy layers with reduced dishing, increased surface planarity, increased throughput and reduced manufacturing costs.

SUMMARY OF THE INVENTION

An aspect of the present invention is a method of polishing a metal layer on a semiconductor substrate with increased through-put.

Additional aspects and other features of the present invention will be set forth in part in the description which follows and in part will become apparent to those having ordinary skill in the art upon examination of the following or may be learned from the practice of the invention. The aspects of the invention may be realized and obtained as particularly pointed out in the appended claims.

According to the present invention, the foregoing and other aspects are achieved in part by a method of polishing a metal layer on a semiconductor substrate. The method comprises forming a metal layer having an exposed surface over a semiconductor substrate. The exposed surface of the metal layer can be formed by immediately depositing a metal layer over the semiconductor substrate or by partially polishing the metal layer after it is deposited on the semiconductor substrate.

In accordance with the present invention, the method further comprises applying a cleaning composition to the metal layer to clean the surface of the metal layer; and polishing the cleaned surface of the metal layer. Embodiments of the present invention include polishing the metal layer formed over the semiconductor substrate to expose the surface of the metal layer and then cleaning the exposed surface of the metal layer with the composition by abrading the metal surface with a polishing pad having the cleaning composition thereon and wherein the polishing pad is substantially free of a polishing slurry.

The cleaning composition is useful for removing contaminates, oxides and/or inhibitors that form on exposed surfaces of the metal layer. Embodiments of the present invention include cleaning or stripping the metal surface with an aqueous composition comprising at least one organic acid, e.g. citric acid. The cleaning composition can additionally comprise at least one amine, e.g. ammonium/hydroxide.

Another aspect of the present invention is a method of polishing a copper containing layer, i.e. a layer comprising copper, over a semiconductor substrate. The method comprises: forming a copper containing layer having an exposed surface over the semiconductor substrate; cleaning the exposed surface of the copper containing layer with a cleaning composition; and polishing the cleaned surface of the copper containing layer.

In an embodiment of the present invention, the method comprises: forming a dielectric layer on the semiconductor substrate; forming a barrier layer on the dielectric layer; forming the copper containing layer on the barrier layer; polishing the copper containing layer to expose a surface thereof; cleaning the exposed surface of the copper containing layer; and polishing the cleaned surface of the copper containing layer.

The cleaning composition can be used to remove a native oxide film which immediately forms after depositing a copper containing layer or which immediately forms on the exposed surface of the copper containing layer upon polishing the copper containing layer during a multi-step CMP process. The cleaning composition is useful in removing inhibiting films, such as those formed by the application of benzotriazole. In an embodiment of the present invention, the cleaning composition comprises about 0.2 wt % to about 80 wt % of citric acid and about 0.03 wt % to about 10 wt % of ammonium hydroxide in an aqueous medium, e.g. deionized or distilled water with or without one or more lower alcohols or glycols.

DESCRIPTION OF THE DRAWINGS

The various features of the present invention will become more apparent and facilitated by reference to the accompanying drawings, submitted for purposes of illustration and not to limit the scope of the invention, where the same numerals represent like structure and wherein.

DESCRIPTION OF THE INVENTION

Figure 1:
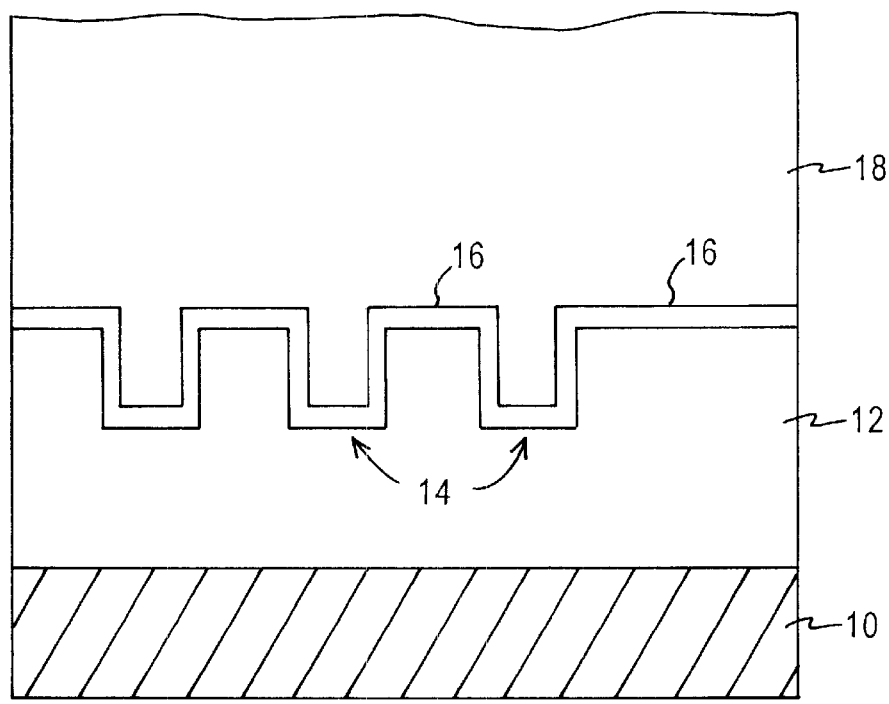
FIG. 1 schematically illustrates a composite arrangement of the present invention prior to planarization.

The present invention achieves planarized metal layers, e.g. copper containing layers, with increased through-put by stripping a metal surface. For example, the inventive composition can be used to strip-off contaminates, oxides and/or inhibitors that have formed on the surface of a metal layer prior to CMP or between CMP steps.

As is known in the art, CMP is often performed in a stepwise fashion, as for example when a bulk metal layer is partially polished on a polishing station as part of a continuous process. In such methods, a single metal layer is typically polished by employing several polishing stations where each station utilizes different polishing parameters, such as a different polishing pad and/or a different chemical slurry to achieve precise polishing and/or planarizing results to ultimately polish and planarize the bulk metal layer to a desired level or feature.

When the metal layer is exposed to air or an aqueous environment between CMP steps, however, a nascent oxide film forms on the exposed surfaces thereof, i.e. the immediately exposed bare metal layer is susceptible to deleterious chemical reactions with environmental oxidants and a thin oxide layer immediately forms on the bare metal layer inhibiting or retarding the rate of further polishing of the metal layer in a subsequent CMP step. The inhibiting film on the surface of the metal, thus, increases the time necessary for completing the polishing and/or planarizing of the metal layer. Inhibitors added during the CMP process may reduce such oxidation, but the resulting inhibiting film formed on the surface of the metal by the inhibitors also retards subsequent polishing of the underlying metal.

Hence, before substantial polishing of the desired bulk underlying metal can begin, the retarding surface materials must be removed. The present invention addresses and solves the problems associated with breaking through oxides, contaminates and/or inhibitors on metal layers by stripping such materials from the surface of the metal before or during CMP thereby reducing the overall polishing time.

In accordance with the present invention, a metal layer over a semiconductor substrate having an exposed surface is cleaned, i.e. the contaminates stripped, by contacting the exposed surface with a composition comprising at least one organic acid. A wide range of organic acids can be employed in the removal of metal oxides contaminates and/or inhibitors in practicing the present invention. For example, monofunctional acids, difunctional acids, hydroxyl/carboxylate acids, chelating and non-chelating acid can be employed. In an embodiment of the present invention, the organic acid is selected from the group of acetic acid, adipic acid, butyric acid; capric acid, caproic acid, caprylic acid, citric acid, glutaric acid, glycolic acid, formic acid, fumaric acid, lactic acid, lauric acid, malic acid, maleic acid, malonic acid, mevalonic acid, myristic acid, oxalic acid, palmitic acid, phthalic acid, propionic acid, pyruvic acid, stearic acid, succinic acid, tartaric acid, valeric acid and derivatives thereof.

The composition of the present invention can additionally comprise at least one amine, such as ammonium hydroxide.

The organic acid and amine should be present in the composition of this invention in an amount that is capable of substantially removing a native oxide layer, contaminates, and/or inhibitors on a metal surface, i.e. the composition should contain a stripping amount of the organic acid or a stripping amount of the organic acid in combination with the amine.

Given the present disclosure and objectives, suitable amounts of reagents and additional components can be determined and optimized in a given situation. Generally, the present invention is applicable for CMP of various metals and alloys thereof, such as titanium, tantalum, nitrides thereof, aluminum, copper, gold, silver, tungsten and alloys thereof. Compositions in accordance with embodiments of the present invention can typically contain about 0.2 wt % to about 80 wt % of the organic acid, e.g. about 10 wt % to about 40 wt %. An amine can also be present in the composition in an amount of about 0.03 wt % to about 10 wt %, e.g. about 0.5 wt % to about 8 wt %. The remaining balance of the composition can comprise deionized water and/or an alcohol solvent.

An aspect of the present invention resides in removing an oxide film formed on an exposed surface of a metal layer during a CMP process. In practicing the present invention, the metal film is formed over a semiconductor substrate by conventional metal forming techniques. The metal surface can then be cleaned by contact with the cleaning composition prior to polishing the bulk metal layer. Alternatively, the formed metal layer can be partially polished or planarized to expose a surface of the metal followed by cleaning the exposed surface with the cleaning composition. For example, contacting the exposed surface of a copper layer with a composition comprising an amount ranging from about 0.2 wt % to about 80 wt % of citric acid and from about 0.03 wt % to about 10 wt % of ammonium hydroxide in an aqueous medium, e.g. deionized or distilled water, can substantially remove the inhibiting layer formed on a copper film surface. The cleaned metal layer can then be polished and/or planarized at a higher polishing rate to achieve a desired level or feature.

Referring to FIG. 1, a composite arrangement of the present invention is illustrated prior to planarization. The composite arrangement comprises interlayer dielectric 12, e.g. silicon oxide, formed overlaying semiconductor substrate 10. In other forms, inter dielectric layer 12 can be a low-k dielectric, borophosphosilicate glass (BPSG), fluorinated TEOS (FTEOS), polymer materials, plasma enhanced TEOS (PETEOS), composites thereof, etc.

Although not specifically illustrated in FIG. 1, conventional integrated circuit contain field isolation and active electrical devices (e.g., capacitors, MOSFETs, bipolar devices, diodes, logic gates, etc.) over the surface of the starting substrate material. These layers are contemplated in the present invention and inherently and collectively included as substrate 10 in FIG. 1. These active devices formed over the substrate are interconnected by semiconductive layers such as polysilicon, amorphous silicon, or salicided regions. In the alternative, these active circuits may also be interconnected by metallic interconnects or some combination of semiconductive interconnects and metallic interconnects. Suitable semiconductor substrates include typical substrates used in the fabrication of integrated circuits, such as doped monocrystalline silicon, gallium, germanium, amorphous silicon, or gallium-arsenide substrates.

A plurality of openings 14 are formed in which a dense array of conductive lines are to be formed in interdieletric layer 12. Barrier layer 16, e.g. a film of Ta, TaN, or TiN, having a thickness of about 200–500 Å, is formed lining openings 14 and on the upper surface of inter dielectric layer 12. The openings 14 are typically spaced apart by a distance of less than one micron, e.g. about 0.2 micron.

A metal containing layer 18 is then deposited over the top surface of barrier layer 16 and within openings 14 in layer 12. Layer 18 can be a metal interconnect, a material such as tungsten, aluminum, copper, gold, silver, refractory metals, composites and alloys thereof.

In accordance with fabricating a copper interconnection, metal containing layer 18 comprises copper and has an initial thickness of about 5,000–18,000 Å overlaying barrier film 16. The present invention contemplates cleaning the surface of the deposited metal layer prior to any CMP processing of the metal layer by contacting the surface of the metal layer with a polishing pad having the cleaning composition.

In an embodiment of the present invention, the semiconductor substrate having the copper containing layer is mounted on a conventional CMP apparatus. An exposed metal surface of the copper containing layer is then cleaned by abrading or rubbing the surface with a polishing pad having the cleaning composition applied or distributed to the pad. In an embodiment of the present invention, the polishing pad is substantially free, if not completely free, of polishing slurry during the cleaning of the copper surface. The cleaning is carried out for a sufficient time, e.g. about 10 seconds, to remove contaminates on the metal surface. For example, the surface of a copper containing layer can be stripped by abrading the surface with a polishing pad having a composition comprising about 10 wt % to about 40 wt % of an organic acid and about 0.5 wt % to about 8 wt % of an amine in water.

Subsequent polishing or planarizing of the bulk underlying copper layer can then be carried out by conventional CMP processing. In an embodiment of the present invention, subsequent polishing or planarizing of the bulk underlying copper layer can be carried out by conventional CMP processing immediately after cleaning the surface of the metal layer. For example, polishing or planarizing of the bulk underlying copper layer can be carried within about a few seconds to within about several hours after cleaning the surface of the copper layer.

Alternatively or additionally, the copper containing layer, as depicted in FIG. 1, is partially polished and/or planarized followed by cleaning the exposed surface of the metal layer with the cleaning composition. In practicing the invention, a multi-station CMP polishing apparatus is employed. The contemplated CMP apparatus has at least one carrier head for manipulating a semiconductor substrate and at least one platen for receiving and rotating a polishing pad. A detailed description of a CMP apparatus can be found in U.S. Pat. No. 5,73 8,574 and assigned to the assignee of the present invention.

Figure 2:
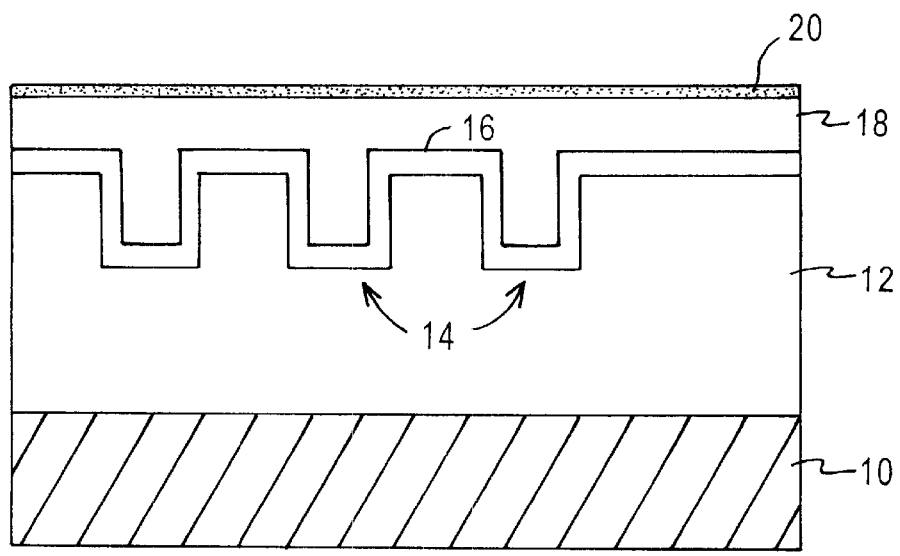
FIG. 2 depicts a composite arrangement prior to applying an oxide removing composition of the present invention.

In an embodiment of the present invention, a copper containing layer is polished employing a first pad (a hard polishing pad) with a conventional slurry to largely or entirely planarize the copper containing layer. The partially polished copper layer, however, has a propensity for developing a thin oxide film over the polished surface. As shown in FIG. 2, the partially polished composite arrangement comprises a planarized copper layer 18 having thin oxide film 20 developed thereon. This oxide film inhibits polishing the underlying bulk copper layer, however.

It has been observed, for example, that a partially polished copper layer develops as much as a 20 Å thick native copper oxide film (i.e. film 20) over a polished copper surface during a multi-step CMP process of the copper layer. The oxide film over the copper layer can significant inhibit polishing of underlying bulk copper layer in a subsequent polishing step thereby reducing through-put. For example, it was observed that cleaning a partially planarized copper layer with a composition comprising about 26 wt % citric acid and about 3 wt % ammonium hydroxide in deionized water reduced the polishing time in a subsequent polishing step of the bulk metal layer by as much as about 50%.

In practicing the present invention, the partially polished, cleaned surface of the copper containing layer is subsequently polished and/or planarized to remove additional material. For example, the cleaned copper layer can be subjected to a subsequent polishing step comprising a second polishing pad (also a hard polishing pad), to further remove copper and stopping on the barrier layer. Completion of forming the interconnect structure includes removing the barrier layer; buffing the surface of the interlayer dielectric to reduce or eliminate scratching or defects; and rinsing the polished substrate.

The present invention is applicable to planarizing during various stages of semiconductor manufacturing. The present invention enjoys particular applicability in the manufacture of high density semiconductor devices with metal features in the deep submicron range with high through-put CMP.

Only the preferred embodiment of the present invention and but a few examples of its versatility are shown and described in the present disclosure. It is to be understood that the present invention is capable of use in various other combinations and environments and is capable of changes and modifications within the scope of the inventive concept as expressed herein.

What is claimed is:

1. A method of polishing a metal layer over a semiconductor substrate, comprising:

forming a metal layer over a semiconductor substrate;

polishing the metal layer to expose the surface of the metal layer;

applying an aqueous composition comprising a stripping amount of at least one organic acid to an exposed surface of the metal layer;

cleaning the exposed metal surface by abrading the metal surface with a polishing pad having the aqueous composition thereon and wherein the polishing pad is substantially free of polishing slurry; and then polishing the exposed surface of the metal layer.

2. A method of polishing a copper containing layer over a semiconductor substrate, the method comprising:

forming a copper containing layer having an exposed surface over the semiconductor substrate;

cleaning the exposed surface of the copper containing layer with a cleaning composition by contacting the metal surface with a polishing pad having the cleaning composition thereon and wherein the polishing pad is substantially free of polishing slurry; and polishing the cleaned surface of the copper containing layer.

3. The method of claim 2, wherein the cleaning composition comprises about 0.2 wt. % to about 80 wt. % of an organic acid and about 0.03 wt. % to about 10 wt. % of an amine in water.

4. The method of claim 2, wherein the cleaning composition comprises about 10 wt. % to about 40 wt. % of citric acid and about 0.5 wt. % to about 8 wt. % of ammonium hydroxide in water.

5. The method of claim 2, wherein cleaning the exposed surface of the copper containing layer comprises removing a native oxide film on the exposed surface of the copper containing layer.

6. The method of claim 2 further comprising:

forming a dielectric layer over the semiconductor substrate;

forming a barrier layer on the dielectric layer; and forming a copper containing layer on the barrier layer.

7. A method of claim 2, wherein the aqueous composition comprises a stripping amount of at least one organic acid and a stripping amount of at least one amine.

* * * * *